United States Patent
Fu et al.

(10) Patent No.: US 8,329,051 B2
(45) Date of Patent: Dec. 11, 2012

(54) METHOD FOR FORMING STAIR-STEP STRUCTURES

(75) Inventors: Qian Fu, Pleasanton, CA (US); Hyun-Yong Yu, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 225 days.

(21) Appl. No.: 12/968,210

(22) Filed: Dec. 14, 2010

(65) Prior Publication Data

US 2012/0149201 A1 Jun. 14, 2012

(51) Int. Cl.
*B44C 1/22* (2006.01)
*H01L 21/302* (2006.01)

(52) U.S. Cl. ............... 216/47; 216/41; 216/49; 216/67; 438/706; 438/710; 438/723; 438/725

(58) Field of Classification Search ............. 216/41, 216/47, 49, 67; 438/706, 710, 723, 725
See application file for complete search history.

(56) References Cited

U.S. PATENT DOCUMENTS

| | | | |
|---|---|---|---|
| 5,532,089 A | 7/1996 | Adair et al. | |
| 6,159,823 A | 12/2000 | Song et al. | |
| 6,727,158 B2 | 4/2004 | Sundt et al. | |
| 7,396,711 B2 | 7/2008 | Shah et al. | |
| 2006/0019443 A1 | 1/2006 | Kim et al. | |
| 2008/0197109 A1* | 8/2008 | Mui et al. | 216/46 |
| 2010/0173498 A1* | 7/2010 | Abatchev et al. | 438/704 |
| 2010/0176440 A1 | 7/2010 | Omura | |
| 2012/0149203 A1 | 6/2012 | Fu et al. | |

FOREIGN PATENT DOCUMENTS

JP 2000-91308 * 3/2000

OTHER PUBLICATIONS

International Search Report dated Apr. 2, 2012 from International Application No. PCT/US11/61965.
Written Opinion dated Apr. 2, 2012 from International Application No. PCT/US11/61965.

* cited by examiner

*Primary Examiner* — Shamim Ahmed
(74) *Attorney, Agent, or Firm* — Beyer Law Group LLP

(57) ABSTRACT

A method for forming a stair-step structure in a substrate is provided. An organic mask is formed over the substrate. A hardmask with a top layer and sidewall layer is formed over the organic mask. The sidewall layer of the hard mask is removed while leaving the top layer of the hardmask. The organic mask is trimmed. The substrate is etched. The forming the hardmask, removing the sidewall layer, trimming the organic mask, and etching the substrate are repeated a plurality of times.

17 Claims, 8 Drawing Sheets

METHOD FOR FORMING STAIR-STEP STRUCTURES

BACKGROUND OF THE INVENTION

The present invention relates to the formation of semiconductor devices. More specifically, the invention relates to the formation of stair-step semiconductor devices.

During semiconductor wafer processing, stair-step features are sometimes required. For example, in 3D flash memory devices, multiple cells are stacked up together in chain format to save space and increase packing density. The stair-step structure allows electrical contact with every gate layer.

SUMMARY OF THE INVENTION

To achieve the foregoing and in accordance with the purpose of the present invention, a method for forming a stair-step structure in a substrate is provided. An organic mask is formed over the substrate. A hardmask with a top layer and sidewall layer is formed over the organic mask. The sidewall layer of the hard mask is removed while leaving the top layer of the hardmask. The organic mask is trimmed. The substrate is etched. The forming the hardmask, removing the sidewall layer, trimming the organic mask, and etching the substrate are repeated a plurality of times.

In another manifestation of the invention a method for making a three dimensional memory structure is provided. A memory stack is provided comprising a plurality of layers, wherein each layer comprises at least two sublayers. An organic mask is formed over the memory stack. A hardmask is formed with a top layer and sidewall layer over the organic mask. The sidewall layer of the hard mask is removed while leaving the top layer of the hardmask. The organic mask is trimmed. The memory stack is etched, so that portions of the memory stack not covered by the organic mask are etched a depth of the thickness of a layer of the plurality of layers. The forming the hardmask, removing the sidewall layer, trimming the organic mask, and etching the substrate are repeated a plurality of times.

In another manifestation of the invention, an apparatus for etching stair-step structures in a substrate is provided. A plasma processing chamber is provided, comprising a chamber wall forming a plasma processing chamber enclosure, a chuck for supporting and chucking a substrate within the plasma processing chamber enclosure, a pressure regulator for regulating the pressure in the plasma processing chamber enclosure, at least one electrode or coil for providing power to the plasma processing chamber enclosure for sustaining a plasma, a gas inlet for providing gas into the plasma processing chamber enclosure, and a gas outlet for exhausting gas from the plasma processing chamber enclosure. A gas source is in fluid connection with the gas inlet and comprises a hardmask deposition gas source, a hardmask sidewall removal gas source, an organic mask trimming gas source, and a substrate etching gas source. A controller is controllably connected to the gas source, the chuck, and the at least one electrode or coil. The controller comprises at least one processor and non-transitory computer readable media. The computer readable media comprises computer readable code for chucking a substrate with an organic mask to the chuck, computer readable code for forming a hardmask over the organic mask, comprising computer readable code for flowing a hardmask deposition gas from the hardmask deposition gas source into the plasma processing chamber, computer readable code for forming a plasma from the hardmask deposition gas, computer readable code for providing a bias voltage, and computer readable code for stopping the hardmask deposition gas, computer readable code for removing a sidewall layer of the hardmask while leaving the top layer of the hardmask, comprising computer readable code for flowing a hardmask sidewall removal gas from the hardmask sidewall removal gas source into the plasma processing chamber, computer readable code for forming a plasma from the hardmask sidewall removal gas, and computer readable code for stopping the hardmask sidewall removal gas, computer readable code for trimming the organic mask, comprising computer readable code for flowing an organic mask trimming gas from the organic mask trimming gas source into the plasma processing chamber, computer readable code for forming a plasma from the organic mask trimming gas, and computer readable code for stopping the organic mask trimming gas, computer readable code for etching the substrate, comprising computer readable code for flowing a substrate etching gas from the substrate etching gas source into the plasma processing chamber, computer readable code for forming a plasma from the substrate etching gas, and computer readable code for stopping the substrate etching gas, and computer readable code for repeating the forming the hardmask, removing the sidewall layer, trimming the organic mask, and etching the substrate a plurality of times.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In the formation of stair-step structures a trim and etch scheme is utilized. Basically, one stair will be etched first then a mask is trimmed to pull back the mask without affecting the substrate. Then another stair is etched, where the trim/etch process is cycled a plurality of times. One difficulty with such a scheme is that during the lateral trim of the mask, the height of the mask is also reduced. Such a reduction may be more than the lateral trim of the mask. Such a reduction places a limit on the number of steps that may be etched before requiring the formation of a new mask.

Figure 1:
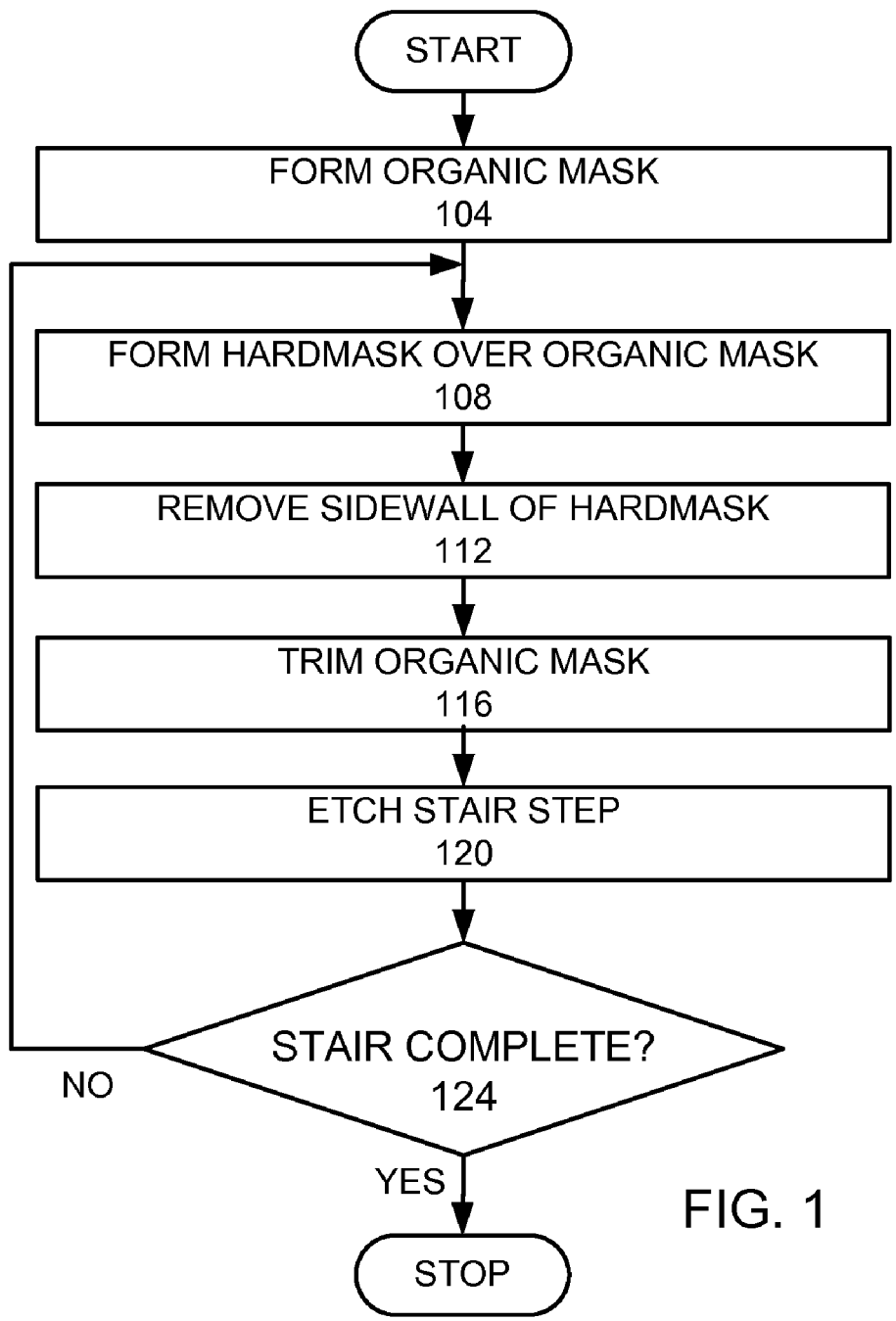
FIG. 1 is a high level flow chart of a process that may be used in an embodiment of the invention.

To facilitate understanding, FIG. 1 is a high level flow chart of a process that may be used in an embodiment of the invention, which forms a stair-step structure in a substrate. An organic mask is formed over a substrate (step 104). A hardmask is formed over the organic mask, where the hardmask has a top layer and a sidewall layer (step 108). The sidewall layer of the hardmask is removed, while leaving the top layer of the hardmask (step 112). The organic mask is trimmed, where the top layer of the hardmask prevents the top of the organic mask from being etched away (step 116). The substrate is then etched to form a step (step 120). Steps 108 to 120 are repeated until the stair-step structure is completed (step 124).

Example

Figure 2A:
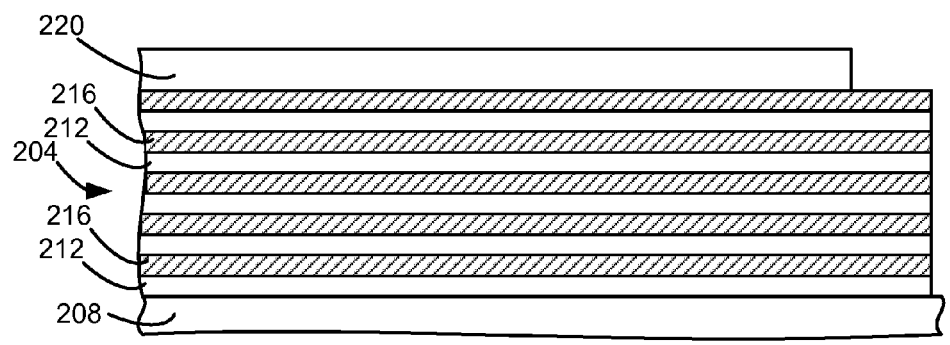
FIGS. 2A-O are schematic cross-sectional views of a memory stack formed according to an embodiment of the invention.

In an example of an implementation of the invention, a stair-step memory array is etched. In such a memory array, memory stacks are formed over a wafer. FIG. 2A is a cross sectional view of a plurality of layers of memory stacks 204 formed over a wafer 208. In this embodiment, each memory stack of the plurality of memory stacks are formed by bilayers of a layer of silicon oxide ($SiO_2$) 216 on top of a layer of polysilicon 212. An organic mask 220 is formed over the memory stacks 204. The organic mask may be a photoresist mask that is formed using a spin on process and the photolithographic patterning. In the alternative, the organic mask may be a spun on or otherwise applied organic layer, without photolithographic patterning.

Figure 3:
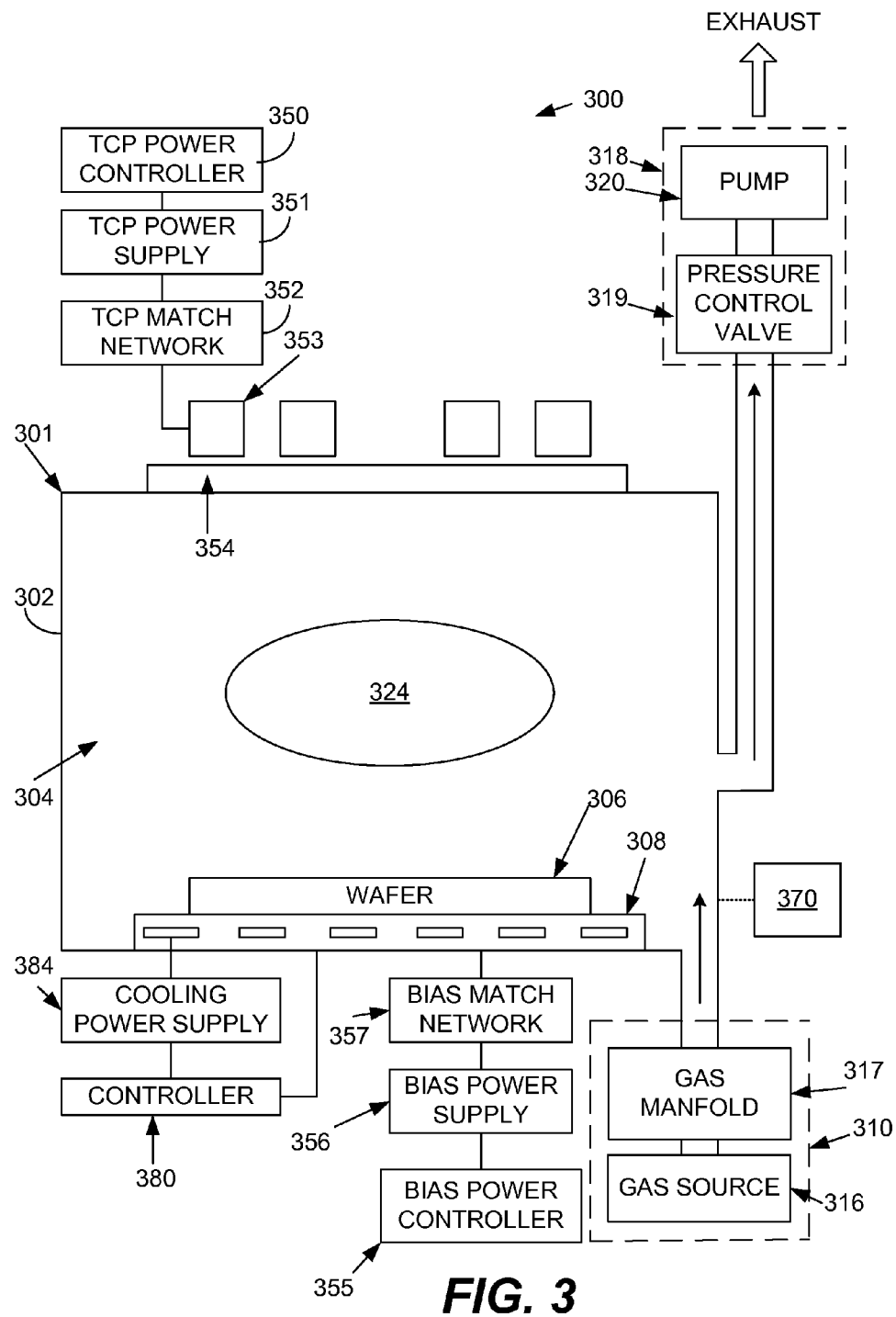
FIG. 3 is a schematic view of a plasma processing chamber that may be used in practicing the invention.

The wafer 208 may be placed in a processing tool to perform subsequent steps. FIG. 3 illustrates a processing tool that may be used in an implementation of the invention. FIG. 3 is a schematic view of a plasma processing system 300, including a plasma processing tool 301. The plasma processing tool 301 is an inductively coupled plasma etching tool and includes a plasma reactor 302 having a plasma processing chamber 304 therein. A transformer coupled power (TCP) controller 350 and a bias power controller 355, respectively, control a TCP power supply 351 and a bias power supply 356 influencing the plasma 324 created within plasma chamber 304.

The TCP power controller 350 sets a set point for TCP power supply 351 configured to supply a radio frequency signal at 13.56 MHz, tuned by a TCP match network 352, to a TCP coil 353 located near the plasma chamber 304. An RF transparent window 354 is provided to separate TCP coil 353 from plasma chamber 304, while allowing energy to pass from TCP coil 353 to plasma chamber 304.

The bias power controller 355 sets a set point for bias power supply 356 configured to supply an RF signal, tuned by bias match network 357, to a chuck electrode 308 located within the plasma chamber 304 creating a direct current (DC) bias above electrode 308 which is adapted to receive a wafer 306, such as a semi-conductor wafer work piece, being processed.

A gas supply mechanism or gas source 310 includes a source or sources of gas or gases 316 attached via a gas manifold 317 to supply the proper chemistry required for the process to the interior of the plasma chamber 304. A gas exhaust mechanism 318 includes a pressure control valve 319 and exhaust pump 320 and removes particles from within the plasma chamber 304 and maintains a particular pressure within plasma chamber 304.

A temperature controller 380 controls the temperature of a cooling recirculation system provided within the chuck electrode 308 by controlling a cooling power supply 384. The plasma processing system also includes electronic control circuitry 370. The plasma processing system may also have an end point detector. An example of such an inductively coupled system is the Kiyo built by Lam Research Corporation of Fremont, Calif., which is used to etch silicon, polysilicon and conductive layers, in addition to dielectric and organic materials. In other embodiments of the invention, a capacitively coupled system may be used.

Figure 4A:
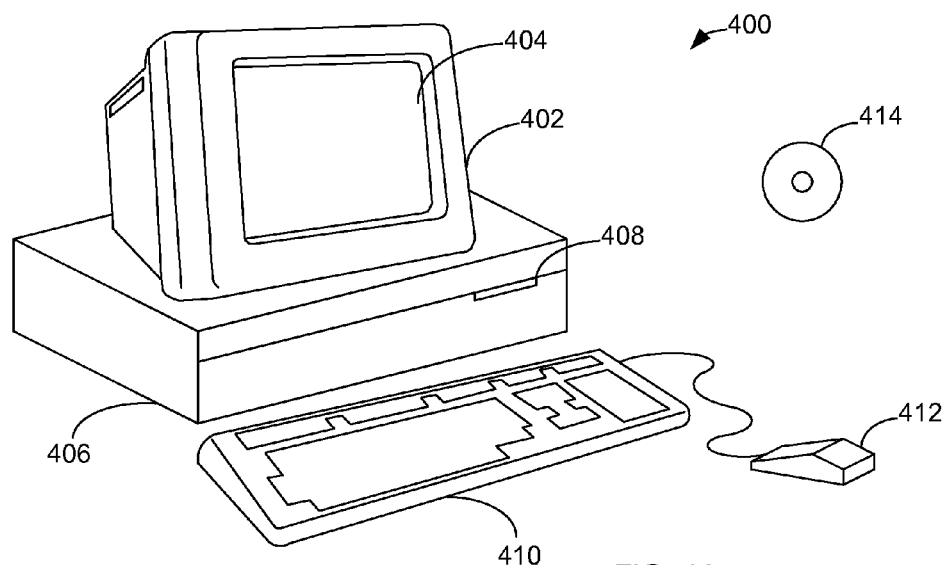
FIGS. 4A-B illustrate a computer system, which is suitable for implementing a controller used in embodiments of the present invention.
Figure 4B:
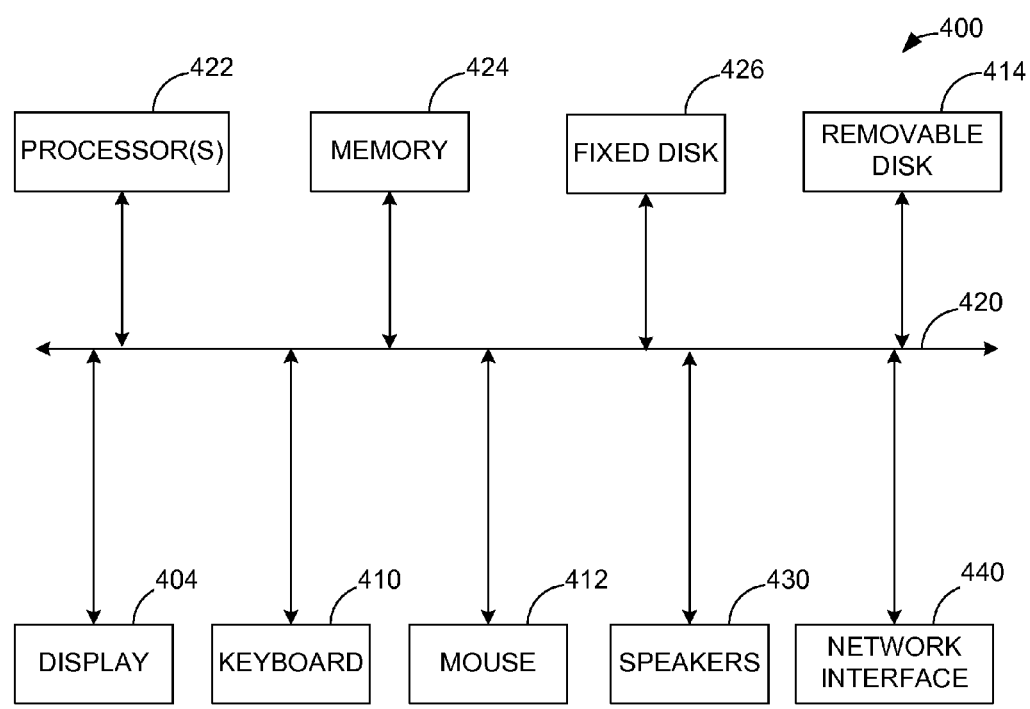

FIGS. 4A and 4B illustrate a computer system 400, which is suitable for implementing a controller for control circuitry 370 used in embodiments of the present invention. FIG. 4A shows one possible physical form of the computer system. Of course, the computer system may have many physical forms ranging from an integrated circuit, a printed circuit board, and a small handheld device up to a huge super computer. Computer system 400 includes a monitor 402, a display 404, a housing 406, a disk drive 408, a keyboard 410, and a mouse 412. Disk 414 is a computer-readable medium used to transfer data to and from computer system 400.

FIG. 4B is an example of a block diagram for computer system 400. Attached to system bus 420 is a wide variety of subsystems. Processor(s) 422 (also referred to as central processing units, or CPUs) are coupled to storage devices, including memory 424. Memory 424 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 426 is also coupled bi-directionally to CPU 422; it provides additional data storage capacity and may also include any of the computer-readable media described below. Fixed disk 426 may be used to store programs, data, and the like and is typically a secondary storage medium (such as a hard disk) that is slower than primary storage. It will be appreciated that the information retained within fixed disk 426 may, in appropriate cases, be incorporated in standard fashion as virtual memory in memory 424. Removable disk 414 may take the form of any of the computer-readable media described below.

CPU 422 is also coupled to a variety of input/output devices, such as display 404, keyboard 410, mouse 412, and speakers 430. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 422 optionally may be coupled to another computer or telecommunications network using network interface 440. With such a network interface, it is contemplated that the CPU might receive information from the network, or might output information to the network in the course of performing the above-described method steps. Furthermore, method embodiments of the present invention may execute solely upon CPU 422 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of tangible and non-transient computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2B:
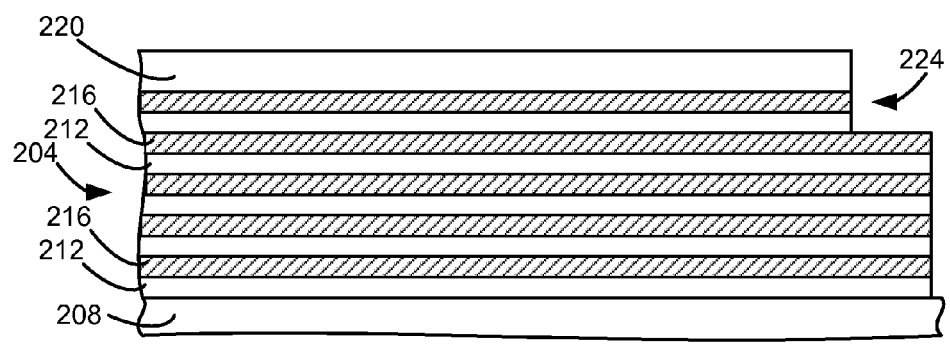
Figure 2C:
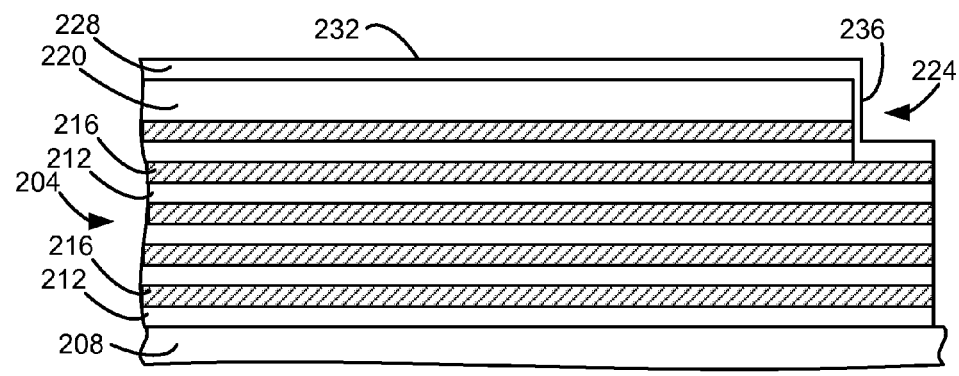

In this example, a first stair-step etch is performed before the hardmask is applied, forming a stair-step 224, as shown in FIG. 2B. A hardmask is formed over the organic mask. FIG. 2C is a cross-sectional view of the memory stacks 204, over which a hardmask layer 228 has been formed. The hardmask layer 228 has a top layer 232 formed over the top of the organic mask 220 and a sidewall layer 236 formed on a sidewall of the organic mask 220. Preferably, the thickness of the top layer 232 of the hardmask layer 228 is greater than the thickness of the sidewall layer 236 of the hardmask layer 228. Although patent drawings are not normally drawn to scale, FIG. 2C is drawn to illustrate that in this example, the thickness of the top layer 232 of the hardmask layer 228 is at least twice the thickness as the thickness of the sidewall layer 236 of the hardmask layer 228, which is more preferable. An example of a recipe for forming the hardmask layer 228 provided a pressure of 10 mtorr. A 13.56 MHz RF power source provided 300 watts of TCP power. A bias voltage source provided a 75 volt bias. A gas source provided a hardmask deposition gas comprising 50 sccm $SiCl_4$ and 100 sccm $O_2$. It should be noted that a bias is provided in forming the hardmask layer 228. The bias helps to cause the thickness of the top layer 232 to be at least twice the thickness of the sidewall layer 236.

Figure 2D:
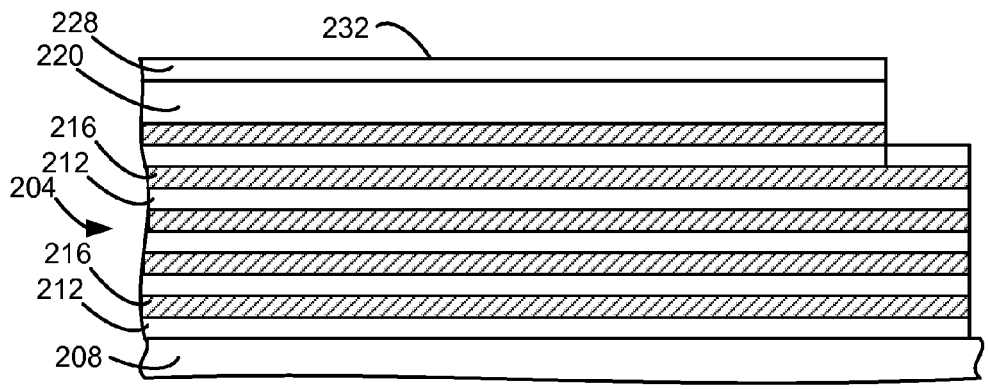

The sidewall layer of the hardmask is removed while leaving the top layer of the hardmask (step 112). FIG. 2D is a cross-sectional view of the stack after the sidewall layer of the hardmask layer 228 has been removed. As can be seen, the top layer 232 of the hardmask layer 228 remains. The top layer 232 may be thinned while removing the sidewall layer, but the top layer 232 remains intact as a complete layer to completely cover to top of each organic mask 220. Having a thicker top layer 232 with respect to sidewall layer helps to accomplish this. In an example of a recipe for removing the sidewall a pressure of 50 mtorr was provided. The RF power source provided 1000 watts of TCP power at 13.56 MHz. A sidewall removal gas of 100 sccm $SF_6$ and 100 sccm Ar was provided.

Figure 2E:
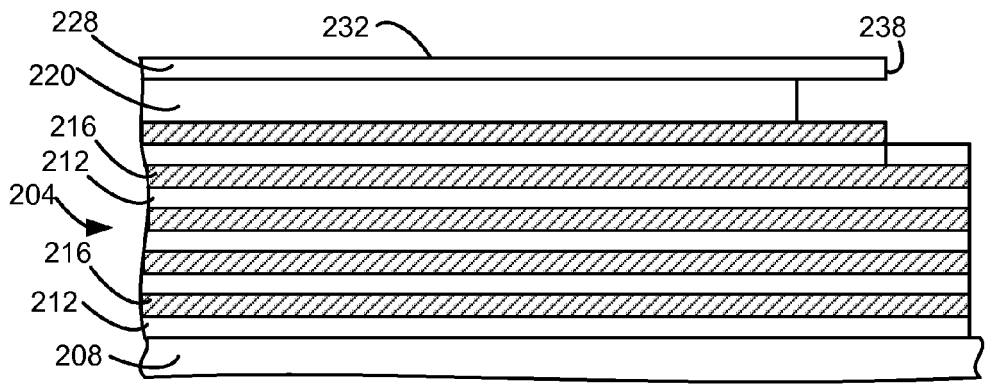

The organic mask is trimmed (step 116). FIG. 2E is a cross-sectional view of the stack, after the organic mask is trimmed. The hardmask layer 228 must be of a material sufficiently different from the organic mask 220, so that the organic mask 220 may be highly selectively trimmed or etched with minimal etching of the hardmask layer 228. Examples of such hardmask materials are silicon oxide, silicon nitride, silicon carbide, and compounds of these. Since in this embodiment the top layer 232 of the hardmask 228 completely covers the top of the organic mask 220, the organic mask is not thinned during the trimming process. The organic mask trim forms a roof 238, which is a part of the top layer of the hardmask layer, under which the organic mask has been trimmed away, so that there is no organic mask under the roof 238, and so that the roof forms a cantilever. In an example of a recipe for trimming the organic mask a pressure of 20 mtorr was provided. The RF power source provided 1000 watts of TCP power. A mask trim gas of 200 sccm $O_2$ and 20 sccm $N_2$ was flowed into the chamber.

Figure 2F:
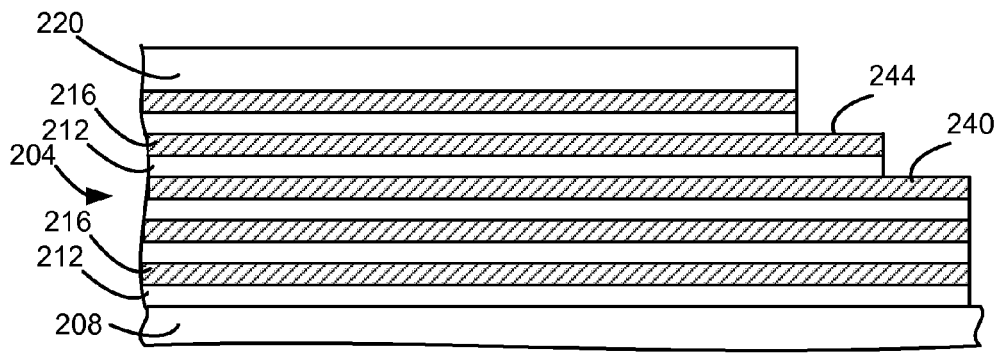

A stair-step is etched using the organic mask as a mask (step 120). FIG. 2F is a cross-sectional view of the stack after a stair-step has been etched, so that there is now a first stair-step 240 and a second stair-step 244. The first stair-step 240 is etched deeper during the etching of the second stair-step 244. In this embodiment the hardmask layer is etched away. This is because, in this embodiment, there is little etch selectivity between the hardmask layer and that the memory stack 204, and since it is desirable to quickly etch away the part of the hard mask over the stair-step. Preferably, the etch selectively etches the memory stack 204 with respect to the organic mask, so that minimal organic mask is etched away. An example of a recipe for etching the stair-step in a memory stack with a silicon oxide based layer used a $C_4F_6$ and $O_2$ based etch gas. Because many different substrates may be etched, many different chemistries may be used for the etch process.

Figure 2G:
Figure 2H:
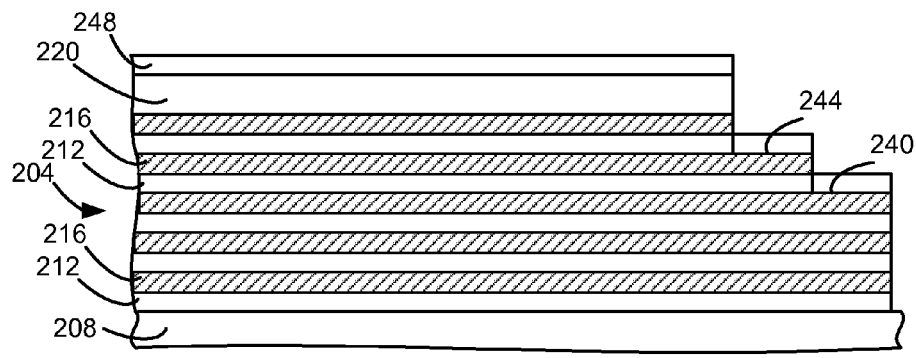
Figure 2I:
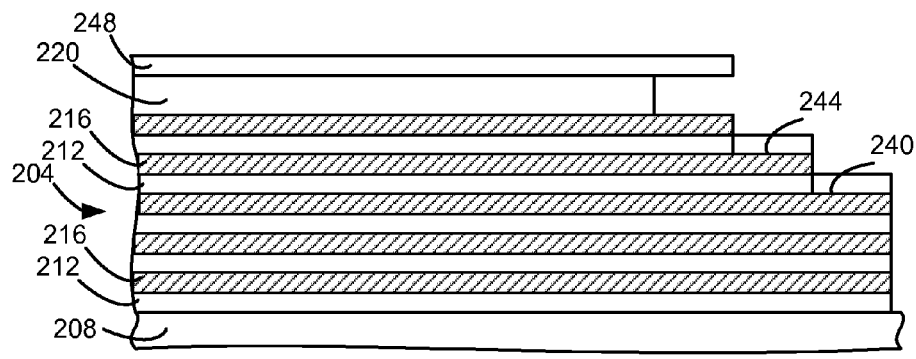
Figure 2J:
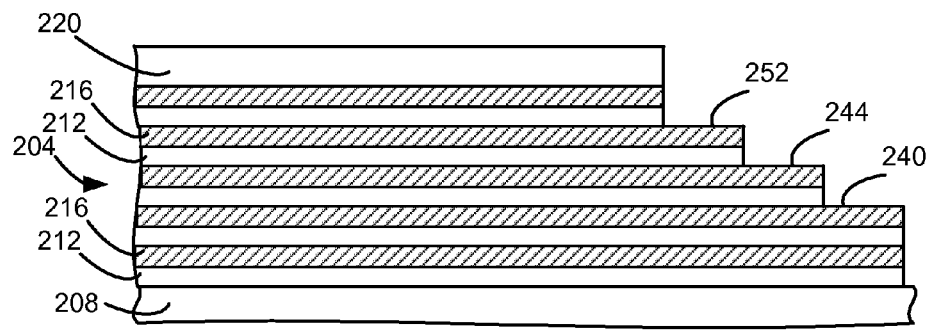

It is determined that additional stair-steps are needed (step 124), so a new hardmask layer is formed over the organic mask (step 108). FIG. 2G is a cross-sectional view of a stack with a hardmask layer 248 deposited over the organic mask 220. The sidewalls of the hardmask layer 248, are removed (step 112), as shown in FIG. 2H. The organic mask 220 is trimmed (step 116), as shown in FIG. 2I forming a cantilever hardmask layer roof. The stair-steps are etched (step 120), as shown in FIG. 2J, forming an additional third step 252 in addition to further etching the first stair-step 240 and the second stair-step 244.

Figure 2K:
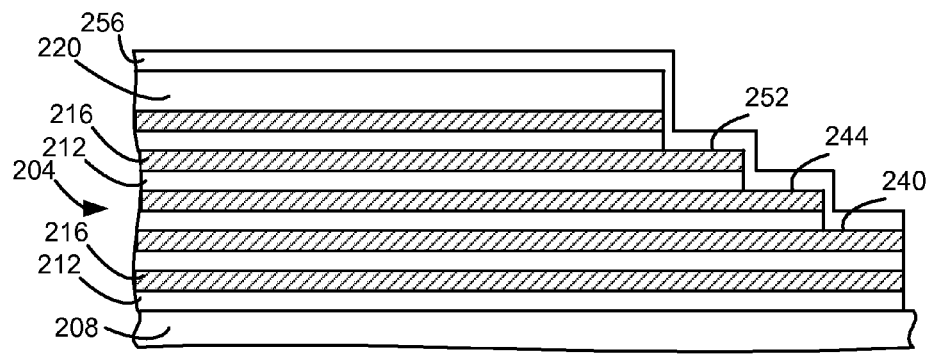
Figure 2L:
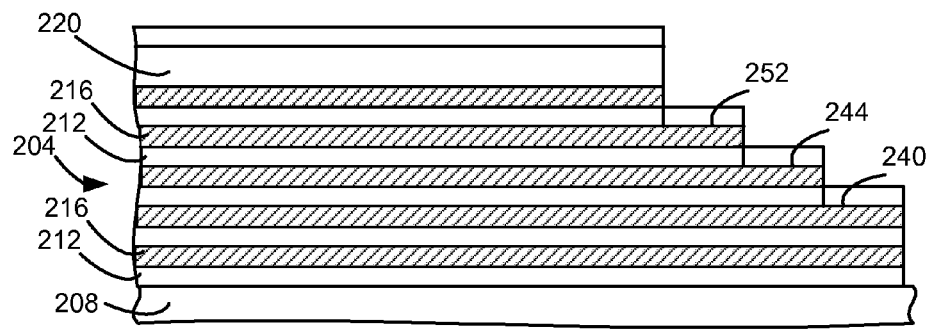
Figure 2M:
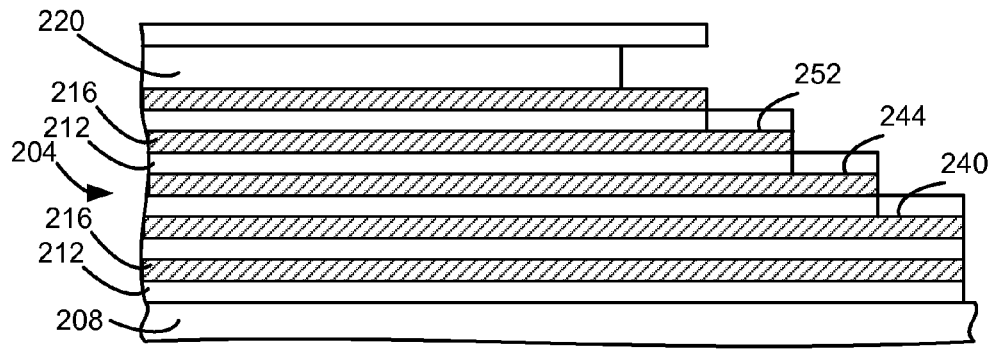
Figure 2N:
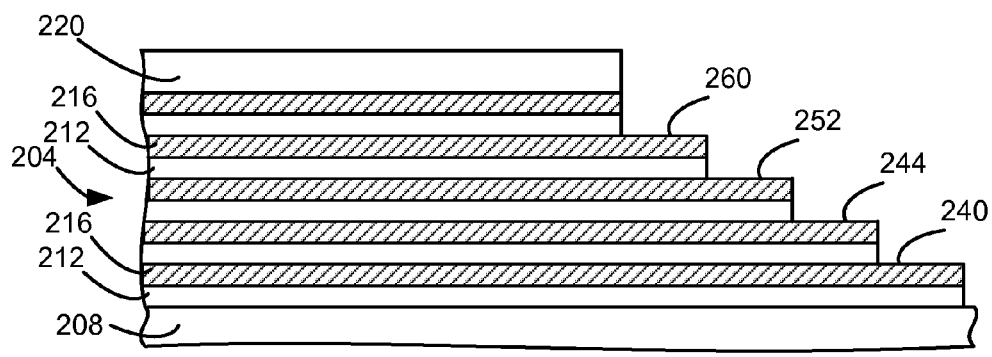

It is determined that additional stair-steps are needed (step 124), so a new hardmask layer is formed over the organic mask (step 108). FIG. 2K is a cross-sectional view of a stack with a hardmask layer 256 deposited over the organic mask 220. The sidewalls of the hardmask layer 256, are removed (step 112), as shown in FIG. 2L. The organic mask 220 is trimmed (step 116), as shown in FIG. 2M forming a cantilever hardmask layer roof. The stair-steps are etched (step 120), as shown in FIG. 2N, forming an additional fourth step 260, in addition to further etching the third step 252, the first stair-step 240 and the second stair-step 244.

Figure 2O:
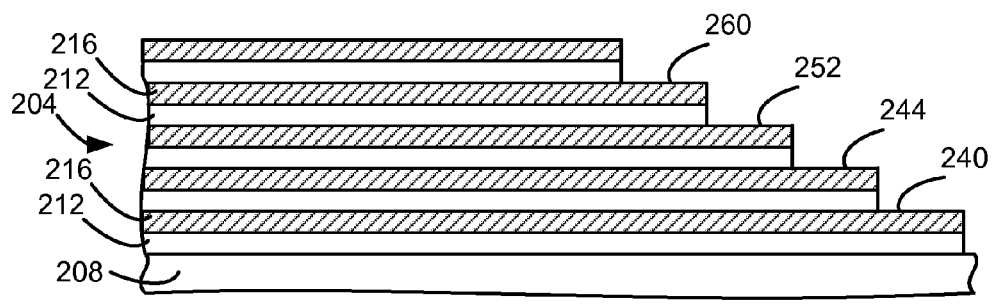

If no additional stair-steps are needed (step 124), the cyclical process is complete. Additional steps may be provided for further processing. For example, the organic mask 220 may be stripped, as shown in FIG. 2O, resulting in a memory stack with five stair-steps counting the top layer. The additional steps, such as stripping the organic mask may be done in the same chamber before removing the substrate from the chamber, or the substrate may be removed from the chamber to perform the additional steps. This embodiment allows the forming of the hardmask, the removing the sidewall, the trimming the organic mask, and the etching the substrate to be performed in the same chamber, so that the same plasma reactor, power supply, coil/electrode, and chuck electrode are used in all of the steps.

Because the process allows the organic mask to be trimmed without thinning the organic mask, a large number of stair-steps may be provided. Preferably, the cycle is repeated at least 3 times, so that at least five stair-steps are provided. More preferably, at least 8 stair-steps may be provided with a single organic mask forming process. More preferably, more than twenty stair-steps may be provided using a single organic mask process. The stair-steps may be formed in one or more directions in other embodiments. In one example, a stair-step structure was created with thirty-two steps.

In other embodiments, the substrate may be made of other materials, to be etched. The substrate may be a solid piece of a single material. In a preferred embodiment, the substrate comprises a plurality of layers where each layer comprises at least two sublayers used to form the memory stacks of the substrate. In one example, at least one sublayer is silicon, such as polysilicon. In another example, each layer comprises three sublayers.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for forming a stair-step structure in a substrate, comprising:
   a) forming an organic mask over the substrate;
   b) forming a hardmask with a top layer and sidewall layer over the organic mask;
   c) removing the sidewall layer of the hard mask while leaving the top layer of the hardmask;
   d) trimming the organic mask;
   e) etching the substrate; and
   f) repeating steps a-e a plurality of times, forming the stair-step structure.

2. The method, as recited in claim 1, wherein a thickness of the top layer of the hardmask is greater than a thickness of the sidewall layer of the hardmask.

3. The method, as recited in claim 2, wherein the trimming the organic mask forms a roof, formed from the top layer of the hardmask, where the organic mask has been trimmed away under the roof.

4. The method, as recited in claim 3, wherein the thickness of the top layer is at least twice the thickness of the sidewall layer.

5. The method, as recited in claim 4, wherein the forming the hardmask over the organic mask provides a bias.

6. The method, as recited in claim 5, wherein the repeating steps a-e is repeated at least 3 times.

7. The method, as recited in claim 6, wherein steps a-e are performed in a single plasma processing chamber.

8. The method, as recited in claim 7, wherein the substrate comprises a plurality of layers, wherein each layer comprises at least two sublayers, wherein at least one of the at least two sublayers is a silicon layer.

9. The method, as recited in claim 1, wherein the trimming the organic mask forms a roof, formed from the top layer of the hardmask, where the organic mask has been trimmed away under the roof.

10. The method, as recited in claim 1, wherein the thickness of the top layer is at least twice the thickness of the sidewall layer.

11. The method, as recited in claim 1, wherein the forming the hardmask over the organic mask provides a bias.

12. The method, as recited in claim 1, wherein the repeating steps a-e is repeated at least 3 times.

13. The method, as recited in claim 1, wherein steps a-e are performed in a single plasma processing chamber.

14. A method for making a three dimensional memory structure, comprising:
   a) providing memory stack comprising a plurality of layers, wherein each layer comprises at least two sublayers;
   b) forming an organic mask over the memory stack;
   c) forming a hardmask with a top layer and sidewall layer over the organic mask;
   d) removing the sidewall layer of the hard mask while leaving the top layer of the hardmask;
   e) trimming the organic mask;
   f) etching the memory stack, so that portions of the memory stack not covered by the organic mask are etched a depth of the thickness of a layer of the plurality of layers; and
   g) repeating steps b-f a plurality of times, forming the three dimensional memory structure.

15. The method, as recited in claim 14, wherein a thickness of the top layer of the hardmask is greater than a thickness of the sidewall layer of the hardmask.

16. The method, as recited in claim 14, wherein the trimming the organic mask forms a roof, formed from the top layer of the hardmask, where the organic mask has been trimmed away under the roof.

17. The method, as recited in claim 14, wherein steps b-f are performed in a single plasma processing chamber.

* * * * *